(12) United States Patent
Shin et al.

(10) Patent No.: US 10,516,384 B2
(45) Date of Patent: Dec. 24, 2019

(54) CIRCUIT FOR GENERATING VOLTAGE

(71) Applicant: SK hynix Inc., Icheon-si (KR)

(72) Inventors: Yoon Jae Shin, Icheon-si (KR); Jae Boum Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/160,733

(22) Filed: Oct. 15, 2018

(65) Prior Publication Data

US 2019/0305760 A1 Oct. 3, 2019

(30) Foreign Application Priority Data

Mar. 27, 2018 (KR) .......................... 10-2018-0035189

(51) Int. Cl.
| | | |
|---|---|---|
| G05F 1/10 | (2006.01) |
| G05F 3/02 | (2006.01) |
| H03K 3/012 | (2006.01) |
| H03K 17/687 | (2006.01) |
| H03K 5/24 | (2006.01) |
| H03K 19/0175 | (2006.01) |

(52) U.S. Cl.
CPC ............... H03K 3/012 (2013.01); H03K 5/24 (2013.01); H03K 17/687 (2013.01); H03K 19/017509 (2013.01)

(58) Field of Classification Search
CPC combination set(s) only.
See application file for complete search history.

(56) References Cited

U.S. PATENT DOCUMENTS

| | | | | |
|---|---|---|---|---|
| 6,292,399 B1 * | 9/2001 | Le | ........................ | G11C 16/28 |
| | | | | 365/185.21 |
| 7,005,908 B2 | 2/2006 | Lee et al. | | |
| 7,324,097 B2 | 1/2008 | Koyama et al. | | |
| 9,054,654 B2 * | 6/2015 | Tanaka | ................ | H03F 3/45076 |
| 2006/0103452 A1 * | 5/2006 | Byeon | ..................... | G05F 3/247 |
| | | | | 327/541 |

FOREIGN PATENT DOCUMENTS

KR  1020120075985 A  7/2012

* cited by examiner

*Primary Examiner* — An T Luu
(74) *Attorney, Agent, or Firm* — William Park & Associates Ltd.

(57) ABSTRACT

A voltage generation circuit is provided. The voltage generation circuit may include an enable signal generator, a voltage controller, and a voltage driver. The enable signal generator may generate an enable signal based on a test signal and an active signal. During activation of the enable signal, the voltage controller may compare a reference voltage with a feedback voltage, amplify the result of comparison, and generate a drive voltage. The voltage driver may output an internal voltage by driving the drive voltage, and generate the feedback voltage corresponding to the internal voltage. The feedback voltage may be pulled down during activation of the enable signal.

19 Claims, 5 Drawing Sheets

CIRCUIT FOR GENERATING VOLTAGE

CROSS-REFERENCE TO RELATED APPLICATION

This application claims priority based upon Korean patent application No. 10-2018-0035189, filed on Mar. 27, 2018, the disclosure of which is hereby incorporated in its entirety by reference herein.

BACKGROUND

1. Technical Field

Embodiments of the present disclosure may generally relate to a circuit for generating a voltage (hereinafter referred to as a voltage generation circuit), and more particularly to a technology for generating an internal voltage used, for example, in various integrated circuits (ICs).

2. Related Art

Various integrated circuits (ICs) may operate internal circuits using an externally received voltage received. However, various kinds of voltages used in ICs may be used, such that it is difficult to receive all external voltages to be used in the ICs. Therefore, the ICs may include voltage generation circuits to generate new voltage levels.

In this case, the voltage generation circuit may include a beta-multiplier voltage generator, a band-gap voltage generator, a Low Drop Output (LDO) regulator voltage generator, etc. When voltage generation circuits are applied to recently developed electronic circuits, it is necessary for the voltage generation circuit to stably supply a voltage appropriate for a user request as well as to reduce power consumption.

SUMMARY

In accordance with an embodiment of the present disclosure, a voltage generation circuit may include: an enable signal generator configured to shift a voltage level based on a test signal and an active signal, and generate a level-shifted enable signal; a voltage controller configured to compare a reference voltage with a feedback voltage, amplify a result of the comparison, and generate a drive voltage, during activation of the enable signal; a voltage driver configured to output an internal voltage by driving the drive voltage, and generate the feedback voltage corresponding to the internal voltage, wherein the feedback voltage is pulled down during activation of the enable signal.

In accordance with an embodiment of the present disclosure, a voltage generation circuit may include: an enable signal generator configured to generate an enable signal based on a test signal and an active signal; a voltage controller configured to compare a reference voltage with a feedback voltage, amplify a result of the comparison, and generate a drive voltage, during activation of the enable signal; a voltage driver configured to level-shift the drive voltage, output a level-shifted internal voltage, and generate the feedback voltage corresponding to the internal voltage wherein the feedback voltage is pulled down during activation of the enable signal.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing a voltage generation circuit that substantially obviates one or more problems due to limitations and disadvantages of the related art.

An embodiment of the present disclosure relates to a voltage generation circuit for supplying a stable voltage and reducing power consumption using a Low Drop Out (LDO) regulator.

It is to be understood that both the foregoing general descriptions and the following detailed description of the present disclosure are exemplary and explanatory and are intended to provide further explanation of the disclosure as claimed.

Figure 1:
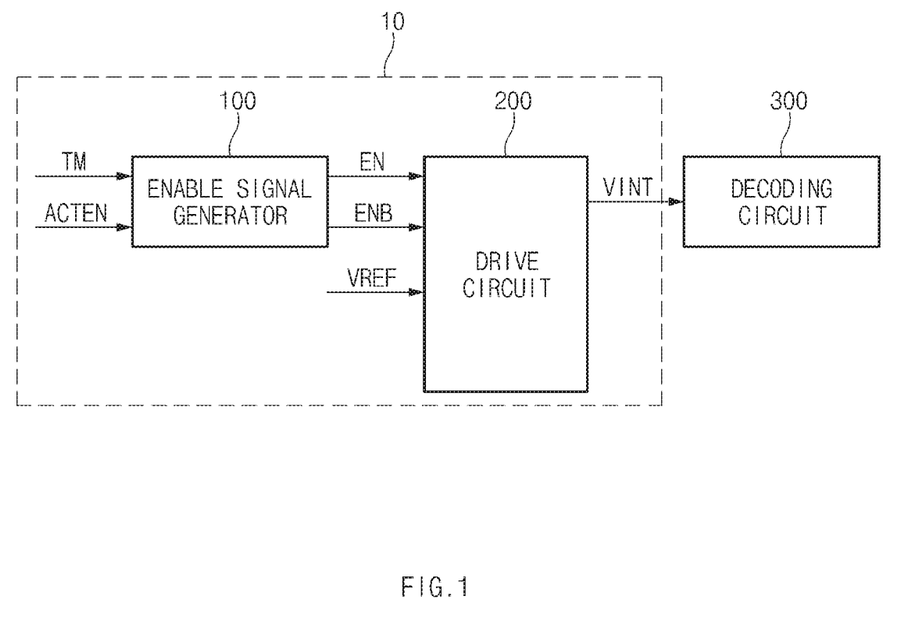
FIG. 1 is a circuit diagram illustrating a representation of an example voltage generation circuit according to an embodiment of the present disclosure.

FIG. 1 is a circuit diagram illustrating a representation of an example voltage generation circuit 10 according to an embodiment of the present disclosure.

Referring to FIG. 1, the voltage generation circuit 10 may include an enable signal generator 100 and a drive circuit 200.

The enable signal generator 100 may generate enable signals EN and ENB for operating the drive circuit 200 based on a test signal TM and an active signal ACTEN. The test signal TM may be activated (or enabled) in a test mode. The active signal ACTEN may be activated (or enabled) in a read or write mode.

When the enable signals EN and ENB are activated, the drive circuit 200 may generate an internal voltage VINT based on a reference voltage VREF.

The embodiment of FIG. 1 has disclosed that the internal voltage VINT generated by the voltage generation circuit 10 is applied as a decoding voltage (for example, a column decoding voltage used in a column decoder) of a decoding circuit 300. However, the scope and spirit of the present disclosure is not limited thereto, and the internal voltage VINT may be used as a bit-line equalizing voltage, a core voltage, etc.

As the degree of integration of a semiconductor memory device (e.g., a dynamic random access memory DRAM) increases and an external power-supply voltage is used as a high voltage, reliability of one or more transistors deteriorates.

In order to address the above-mentioned issues, a voltage conversion circuit capable of reducing a power-supply voltage in each chip has been widely used. When a low power-supply voltage is used, the voltage conversion circuit may reduce power consumption. When an internal voltage source is used as a constant voltage, the voltage conversion circuit can guarantee a stable power-supply voltage irrespective of a change in an external power-supply voltage, thereby stabilizing the chip operation.

There are various kinds of power-supply voltages generated in a single chip. In order to always generate a constant internal voltage in various voltage conditions irrespective of the external environment, many circuits may be used. Therefore, an embodiment of the present disclosure may have a high response speed and at the same time may control a large load, using a Low Drop Output (LDO)—based voltage generation circuit.

Figure 2:
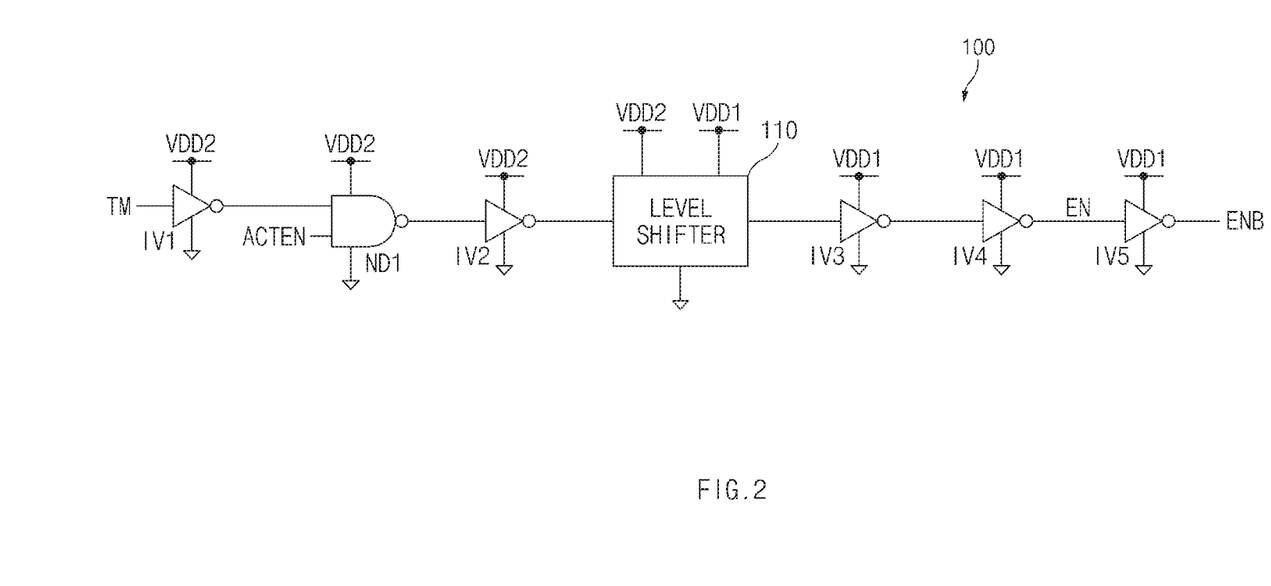
FIG. 2 is a circuit diagram illustrating a representation of an example enable signal generator for use in the voltage generation circuit illustrated in FIG. 1 according to an embodiment of the present disclosure.

FIG. 2 is a circuit diagram illustrating the enable signal generator 100 for use in the voltage generation circuit illustrated in FIG. 1 according to an embodiment of the present disclosure.

Referring to FIG. 2, the enable signal generator 100 may shift a voltage level based on the test signal TM and the active signal ACTEN, thereby generating level-shifted enable signals EN and ENB. When the test signal TM is deactivated (or disabled), the enable signal generator 100 may selectively activate (enable) the enable signals EN and ENB based on a logic level of the active signal ACTEN.

The enable signal generator 100 may include a plurality of inverters IV1~IV5, a NAND gate ND1, and a level shifter 110. The NAND gate ND1 may perform a NAND operation on the test signal TM inverted by the inverter IV1 and the active signal ACTEN. The inverter IV2 may invert an output signal of the NAND gate ND1, and may thus output the inverted signal of the NAND gate ND1 to the level shifter 110.

The level shifter 110 may generate a power-supply voltage VDD1 by level-shifting a power-supply voltage VDD2. For example, the semiconductor memory device (for example, DRAM) may generate a power source needed for operation using a heterogeneous power source. For this purpose, the level shifter 110 may increase a level of the power-supply voltage VDD2, thereby generating the power-supply voltage VDD1 used as a power source in the drive circuit 200.

That is, the test signal TM and the active signal ACTEN may use the power-supply voltage VDD2 as a power source. Accordingly, the level shifter 110 may perform level-shifting from the power-supply voltage VDD2 to the power-supply voltage VDD1 to control the drive circuit 200 in which the power-supply voltage VDD1 is used as a power source.

The inverters IV3 and IV4 may perform non-inversion delaying of the output signal of the level shifter 110, and may thus output the enable signal EN. The inverter IV5 may inversion-drive the enable signal EN, and may thus output the enable signal ENB. That is, the enable signal ENB may have a phase opposite to that of the enable signal EN.

In this case, the inverters IV1 and IV2 included in a previous stage of the level shifter 110 and the NAND gate ND1 may be driven using the power-supply voltage VDD2 as a power source. The inverters IV3~IV5 included in a post stage of the level shifter 110 may be driven using the power-supply voltage VDD1 as a power source. The power-supply voltage VDD1 may have a greater voltage than the power-supply voltage VDD2.

An embodiment of the present disclosure has disclosed, for example, that the level shifter 110 generates the power-supply voltage VDD1 having a greater voltage than the power-supply voltage VDD2. However, the scope and spirit of the present disclosure is not limited thereto, and the level shifter 110 may also generate a power-supply voltage VDD or a pumping voltage VPPPEXT having a greater voltage than the power-supply voltage VDD2. The pumping voltage VPPPEXT may be greater than the power-supply voltage VDD1. That is, the descending order of the above voltage levels is represented by VPPEXT→VDD1→VDD→VDD2, as denoted by "VPPEXT>VDD1>VDD>VDD2".

Figure 3:
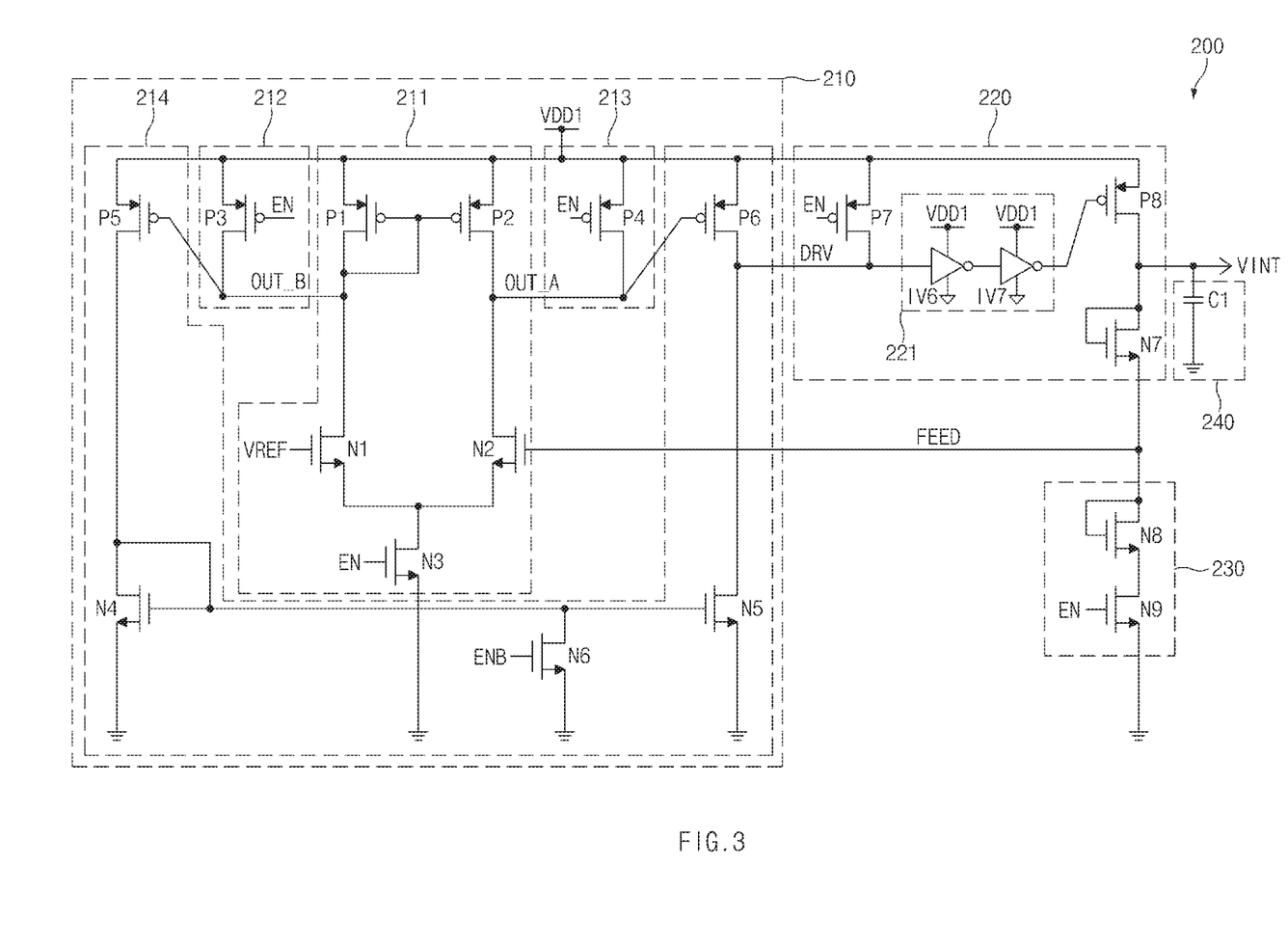
FIG. 3 is a circuit diagram illustrating a representation of an example drive circuit for use in the voltage generation circuit illustrated in FIG. 1 according to an embodiment of the present disclosure.

FIG. 3 is a circuit diagram illustrating the drive circuit 200 for use in the voltage generation circuit illustrated in FIG. 1 according to an embodiment of the present disclosure.

Referring to FIG. 3, the drive circuit 200 may include a voltage controller 210, a voltage driver 220, a pull-down driver 230, and a load circuit 240.

During activation of the enable signal EN, the voltage controller 210 may compare a reference voltage VREF with a feedback voltage FEED, may amplify the result of comparison, and may thus generate a drive voltage DRV. The voltage controller 210 may include a comparator 211, pull-up circuits 212 and 213, and a biasing circuit 214.

The comparator 211 may compare the reference voltage VREF with the feedback voltage FEED. The comparator 211 may include a plurality of PMOS transistors P1 and P2 and a plurality of NMOS transistors N1~N3.

The PMOS transistors P1 and P2 may be coupled to a node OUT_B through a common gate terminal, and may receive the power-supply voltage VDD1 through a common source terminal. The NMOS transistor N1 may be coupled between the node OUT_B and the NMOS transistor N3. The NMOS transistor N2 may be coupled between a node OUT_A and the NMOS transistor N3. The NMOS transistor N1 may receive the reference voltage VREF through a gate terminal of the NMOS transistor N1. The NMOS transistor N2 may receive the feedback voltage FEED through a gate terminal of the NMOS transistor N2. The NMOS transistor N3 may be coupled between a common source terminal of the NMOS transistors N1 and N2 and a ground voltage terminal, such that the NMOS transistor N3 may receive the enable signal EN through a gate terminal of the NMOS transistor N3.

The pull-up circuit 212 may pull up the node OUT_B to the power-supply voltage (VDD1) level during activation of the enable signal EN. The pull-up circuit 212 may include a PMOS transistor P3. The PMOS transistor P3 may be coupled between the power-supply voltage (VDD1) input terminal and the node OUT_B, and may receive the enable signal EN through a gate terminal of the PMOS transistor P3.

The pull-up circuit 213 may pull up the node OUT_A to the power-supply voltage (VDD1) level during activation of the enable signal EN. The pull-up circuit 213 may include a PMOS transistor P4. The PMOS transistor P4 may be coupled between the power-supply voltage (VDD1) input terminal and the node OUT_A, and may receive the enable signal EN through a gate terminal of the PMOS transistor P4.

The biasing circuit 214 may control the drive voltage DRV based on a voltage of the node OUT_A and a voltage of the node OUT_B. The biasing circuit 214 may include a plurality of PMOS transistors P5 and P6 and a plurality of NMOS transistors N4~N6.

The PMOS transistor P5 and the NMOS transistor N4 may be coupled in series between the power-supply voltage (VDD1) input terminal and the ground voltage terminal. A gate terminal of the PMOS transistor P5 may be coupled to the node OUT_B. A gate terminal and a drain terminal of the NMOS transistor N4 may be commonly coupled to each other.

The PMOS transistor P6 and the NMOS transistor N5 may be coupled in series between the power-supply voltage (VDD1) input terminal and the ground voltage terminal. A gate terminal of the PMOS transistor P6 may be coupled to the node OUT_A. A gate terminal of the NMOS transistor N5 may be commonly coupled to a gate terminal of the NMOS transistor N4. The NMOS transistor N6 may be coupled between a common gate terminal of the NMOS transistors N4 and N5 and the ground voltage terminal, such that the NMOS transistor N6 may receive the enable signal ENB through a gate terminal of the NMOS transistor N6.

The voltage driver 220 may output the internal voltage VINT by driving the drive voltage DRV. The voltage driver 220 may include PMOS transistors P7 and P8 (pull-up drive elements), a delay circuit 221, and an NMOS transistor N7 (pull-down drive element).

The PMOS transistor P7 may be coupled between the power-supply voltage (VDD1) input terminal and the drive voltage (DRV) output terminal, and may receive the enable signal EN through a gate terminal of the PMOS transistor P7. The delay circuit 221 may include the inverters IV6 and IV7 configured to perform non-inversion delaying of the drive voltage DRV. The PMOS transistor P8 may be coupled between the power-supply voltage (VDD1) input terminal and the internal voltage VINT, and may receive an output signal of the inverter IV7 through a gate terminal of the PMOS transistor P8. The NMOS transistor N7 may be coupled between the internal voltage (VINT) output terminal and the feedback voltage (FEED) output terminal, such that a gate terminal and a drain terminal of the NMOS transistor N7 may be commonly coupled to each other.

The pull-down driver 230 may pull down the feedback voltage FEED during activation of the enable signal EN. The pull-down driver 230 may include NMOS transistors N8 and N9 (pull-down drive elements).

The NMOS transistors N8 and N9 may be coupled in series between the feedback voltage (FEED) output terminal and the ground voltage terminal. A gate terminal and a drain terminal of the NMOS transistor N8 may be commonly coupled to each other. The NMOS transistor N9 may receive the enable signal EN through a gate terminal of the NMOS transistor N9.

The load circuit 240 may include a capacitor C1 coupled between the internal voltage (VINT) output terminal and the ground voltage terminal. The capacitor C1 may control a load capacitance of the internal voltage VINT.

Operations of the embodiment including the above-mentioned constituent elements will hereinafter be described below.

If the test signal TM is deactivated to a low level and the active signal ACTEN is activated, the level shifter 110 of the enable signal generator 100 may generate the power-supply voltage VDD1 having a high voltage level. The enable signal generator 100 may activate the enable signal EN using the power-supply voltage VDD1 as a power source.

That is, when the test signal TM is activated, the enable signal ENB is at a high level, such that the voltage controller 210 does not operate. In contrast, when the active signal ACTEN is activated, the enable signal ENB is at a low level and the enable signal EN is at a high level, such that the voltage controller 210 may operate.

If the enable signal EN generated from the enable signal generator 100 is activated, the NMOS transistor N3 is turned on, such that the comparator 211 may operate. In this case, the PMOS transistor P3 of the pull-up circuit 212 and the PMOS transistor P4 of the pull-up circuit 213 may be turned off such that the pull-up circuits 212 and 213 no longer operate. The comparator 211 may compare the reference voltage VREF with the feedback voltage FFED, and may output the result of comparison to the nodes OUT_A and OUT_B.

In this case, drive capabilities of the NMOS transistors N1 and N2 in the comparator 211 are changed based on the reference voltage VREF and the feedback voltage FEED, such that voltages of both output nodes OUT_A and OUT_B are changed. During activation of the enable signal EN, the feedback voltage (FEED) level may be controlled based on the voltage of the voltage driver 220 and the voltage of the pull-down driver 230.

For example, the initial value of the internal voltage VINT may be set to 0V. During a power-up operation, the comparator 211 may compare the feedback voltage FEED applied to gate terminals of the NMOS transistors N1 and N2 with the reference voltage VREF.

The NMOS transistor N3 of the comparator 211 may be turned on by activation of the enable signal EN. The PMOS transistor P5 is turned on due to the node OUT_B having a low level, such that current mirroring is formed by the NMOS transistors N4 and N5. If a current flows in the NMOS transistor N5, the voltage level of the node OUT_A is relatively lower than the voltage level of the node OUT_B because of the current mirroring between the PMOS transistors P1 and P2.

That is, when the feedback voltage FEED level is lower than the reference voltage VREF in response to the internal voltage VINT, the drive voltage DRV of the voltage controller 210 is at a low level. Therefore, the PMOS transistor P8 is turned on, such that the internal voltage VINT may increase.

In contrast, when the internal voltage VINT increases to a predetermined voltage and the feedback voltage FEED is greater than the reference voltage VREF, the drive voltage DRV of the voltage controller 210 is at a high level. In this case, the PMOS transistor P8 is turned off, such that the internal voltage VINT does not further increase. In this case, the PMOS transistor P8 is turned off, such that the internal voltage (VINT) level does not further increase.

Thereafter, when the enable signal EN is deactivated and the enable signal ENB is activated, the pull-up circuits 212 and 213 and the NMOS transistor N6 are turned on. As a result, the voltage controller 210 is precharged with the power-supply voltage (VDD1) level, such that the comparator 211 does not operate.

During activation of the enable signal EN, the voltage driver 220 may delay the drive voltage DRV and may thus output the delayed drive voltage DRV. The PMOS transistor P8 of the voltage driver 220 is selectively turned on according to the output signal of the delay circuit 221, such that a level of the internal voltage VINT is controlled. During deactivation of the enable signal EN, the PMOS transistor P7 is turned on. As a result, the drive voltage DRV is pulled up to the power-supply voltage (VDD1) level, such that the voltage driver 220 does not operate.

As described above, the enable signal generator 100 according to embodiments of the present disclosure may generate the enable signal EN using the level-shifted power-supply voltage VDD1 as a power source. The low drop out (LDO) based voltage generation circuit according to an embodiment of the present disclosure may control the comparator 211 for comparing two input signals with each other, in response to the enable signal EN, such that the LDO based voltage generation circuit may rapidly and stably output the drive voltage DRV to the output terminal.

Figure 4:
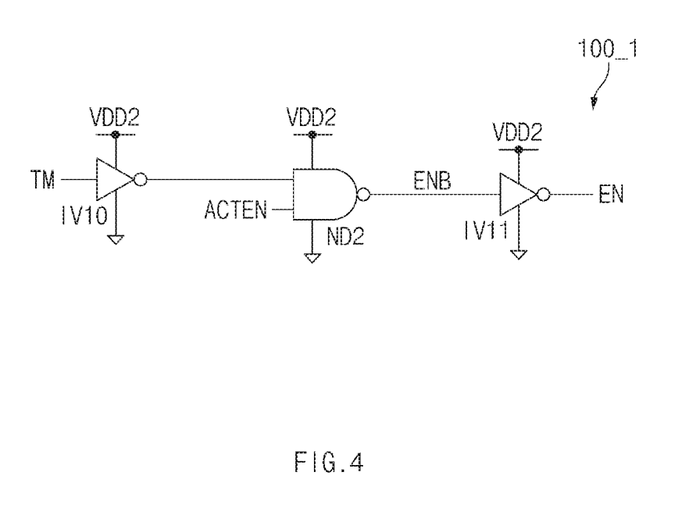
FIG. 4 is a circuit diagram illustrating a representation of an example enable signal generator for use in the voltage generation circuit illustrated in FIG. 1 according to another embodiment of the present disclosure.

FIG. 4 is a circuit diagram illustrating the enable signal generator 100 for use in the voltage generation circuit illustrated in FIG. 1 according to an embodiment of the present disclosure.

Referring to FIG. 4, the enable signal generator 100_1 may generate the enable signals EN and ENB based on the test signal TM and the active signal ACTEN. During deactivation of the test signal TM, the enable signal generator 100_1 may selectively activate the enable signals EN and ENB in response to a logic level of the active signal ACTEN.

The enable signal generator 100_1 may include a plurality of inverters IV10 and IV11 and a NAND gate ND2. In this case, the inverters IV10 and IV11 and the NAND gate ND2 in the enable signal generator 100_1 may be driven using the power-supply voltage VDD2 as a power source.

The NAND gate ND2 may perform a NAND operation on the test signal TM inverted by the inverter IV10 and the active signal ACTEN, and may thus output the enable signal ENB. The inverter IV11 may output the enable signal EN by inverting the enable signal ENB. That is, the enable signal ENB may have a phase opposite to that of the enable signal EN.

As described above, the enable signal generator 100_1 illustrated in FIG. 4 does not include a level shifter as compared to the embodiment of FIG. 2. The enable signal generator 100_1 illustrated in FIG. 4 may use the power-supply voltage VDD2 as a power source to drive the enable signal generator 100 of FIG. 2 differently than enable the signal generator 100_1.

Figure 5:
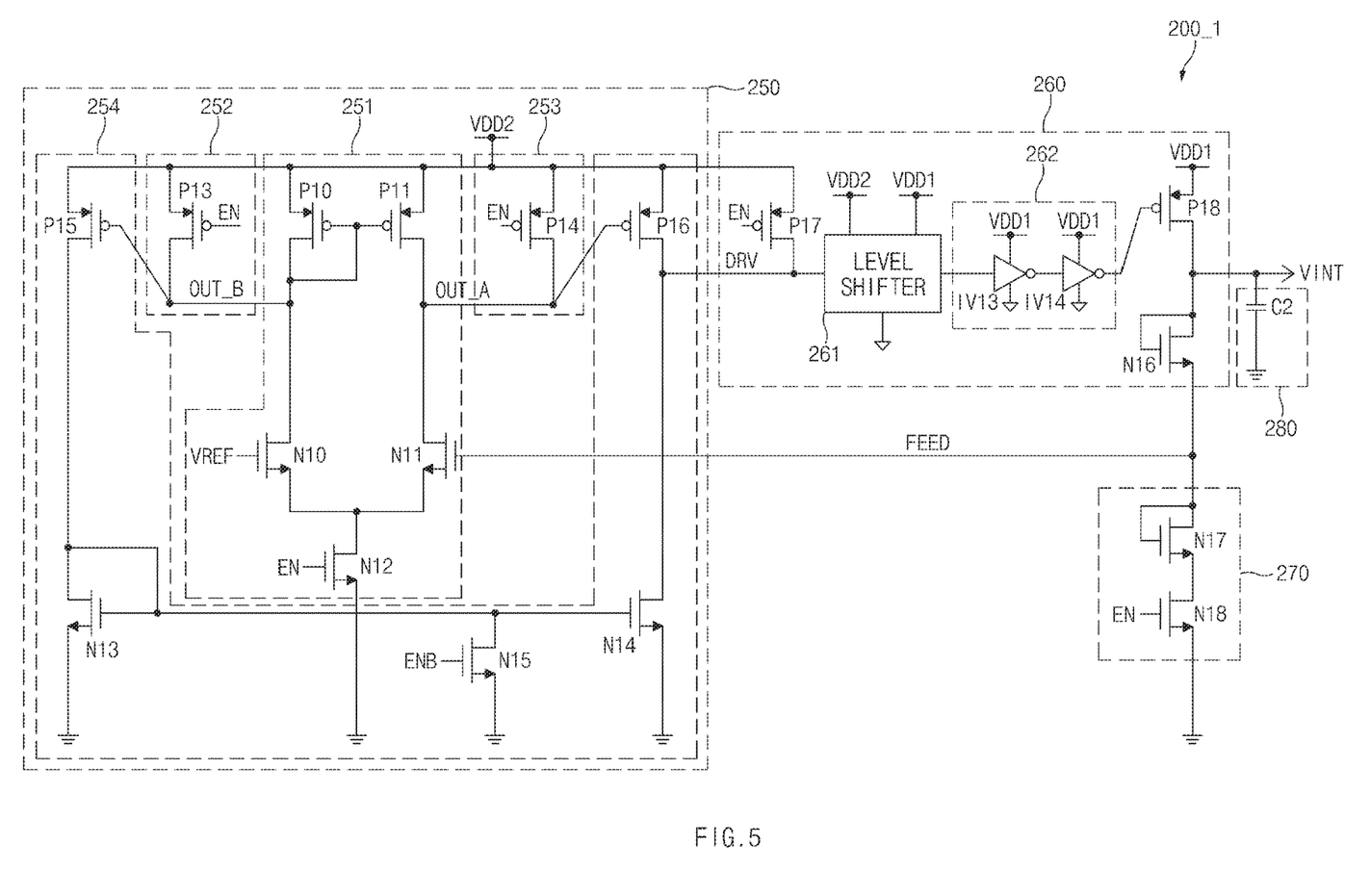
FIG. 5 is a circuit diagram illustrating a representation of an example drive circuit for use in the voltage generation circuit illustrated in FIG. 1 according to another embodiment of the present disclosure.

FIG. 5 is a circuit diagram illustrating the drive circuit 200 for use in the voltage generation circuit illustrated in FIG. 1 according to an embodiment of the present disclosure.

Referring to FIG. 5, the drive circuit 200_1 may include a voltage controller 250, a voltage driver 260, a pull-down driver 270, and a load circuit 280.

During activation of the enable signal EN, the voltage controller 250 may compare the reference voltage VREF with the feedback voltage FEED, may amplify the result of comparison, and may thus generate the drive voltage DRV. The voltage controller 250 may include a comparator 251, pull-up circuits 252 and 253, and a biasing circuit 254.

The comparator 251 may compare the reference voltage VREF with the feedback voltage FEED. The comparator 251 may include a plurality of PMOS transistors P10 and P11 and a plurality of NMOS transistors N10~N12.

A common gate terminal of the PMOS transistors P10 and P11 may be coupled to the node OUT_B, and a common source terminal of the PMOS transistors P10 and P11 may receive the power-supply voltage VDD2. The NMOS transistor N10 may be coupled between the node OUT_B and the NMOS transistor N12. The NMOS transistor N11 may be coupled between the node OUT_A and the NMOS transistor N12. The NMOS transistor N10 may receive the reference voltage VREF through a gate terminal of the NMOS transistor N10. The NMOS transistor N11 may receive the feedback voltage FEED through a gate terminal of the NMOS transistor N11. The NMOS transistor N12 may be coupled between a common source terminal of the NMOS transistors N10 and N11 and the ground voltage terminal, and may receive the enable signal EN through a gate terminal of the NMOS transistor N12.

The pull-up circuit 252 may pull up the node OUT_B to the power-supply voltage (VDD2) level during activation of the enable signal EN. The pull-up circuit 252 may include a PMOS transistor P13. The PMOS transistor P13 may be coupled between the power-supply voltage (VDD2) input terminal and the node OUT_B, and may receive the enable signal EN through a gate terminal of the PMOS transistor P13.

The pull-up circuit 253 may pull up the node OUT_A to the power-supply voltage (VDD2) level during activation of the enable signal EN. The pull-up circuit 253 may include a PMOS transistor P14. The PMOS transistor P14 may be coupled between the power-supply voltage (VDD2) input terminal and the node OUT_A, and may receive the enable signal EN through a gate terminal of the PMOS transistor P14.

The biasing circuit 254 may supply a biasing voltage to the comparator 251 in response to voltages of the nodes OUT_A and OUT_B. The biasing circuit 254 may include a plurality of PMOS transistors P15 and P16 and a plurality of NMOS transistors N13~N15.

The PMOS transistor P15 and the NMOS transistor N13 may be coupled in series between the power-supply voltage (VDD2) input terminal and the ground voltage terminal. A gate terminal of the PMOS transistor P15 may be coupled to the node OUT_B. A gate terminal and a drain terminal of the NMOS transistor N13 may be commonly coupled to each other.

The PMOS transistor P16 and the NMOS transistor N14 may be coupled in series between the power-supply voltage (VDD2) input terminal and the ground voltage terminal. A gate terminal of the PMOS transistor P16 may be coupled to the node OUT_A. A gate terminal of the NMOS transistor N14 may be commonly coupled to a gate terminal of the NMOS transistor N13. The NMOS transistor N15 may be coupled between a common gate terminal of the NMOS transistors N13 and N14 and the ground voltage terminal, such that the NMOS transistor N15 may receive the enable signal ENB through a gate terminal of the NMOS transistor N15.

The voltage driver 260 may perform level shifting of the drive voltage DRV, may delay the level-shifted drive voltage DRV, and may thus output the internal voltage VINT. The voltage driver 260 may include PMOS transistors P17 and P18 (pull-up drive elements), a level shifter 261, a delay circuit 262, and an NMOS transistor N16 (pull-down drive element).

The PMOS transistor P17 may be coupled between the power-supply voltage (VDD2) input terminal and the drive voltage (DRV) output terminal, and may receive the enable signal EN through a gate terminal of the PMOS transistor P17.

The level shifter 261 may generate the power-supply voltage VDD1 by level-shifting the power-supply voltage VDD2. An embodiment of the present disclosure has disclosed, for example, that the level shifter 261 generates the power-supply voltage VDD1 by level-shifting the power-supply voltage VDD2. However, the scope and spirit of the present disclosure is not limited thereto, and it should be noted that the level shifter 261 may shift the power-supply voltage VDD2 to the pumping voltage (VPPPEXT) level.

For example, the semiconductor memory device (for example, DRAM) may generate a power source needed for operation using a heterogeneous power source. For this purpose, the level shifter 261 may increase the power-supply voltage (VDD2) level, thereby generating the power-supply voltage VDD1 used as a power source of the internal voltage VINT. The level of the power-supply voltage VDD1 may be higher than the power-supply voltage VDD2.

That is, the voltage controller 250 may use the power-supply voltage VDD2 as a power source. The inverters IV13~IV14 included in a post stage of the level shifter 261 may be driven using the power-supply voltage VDD1 as a power source. Therefore, the level shifter 261 may perform level shifting from the power-supply voltage VDD2 to the power-supply voltage VDD1 to generate the internal voltage VINT by which the power-supply voltage VDD1 is used as a power source.

The delay circuit 262 may include inverters IV13 and IV14 for performing non-inversion delaying of the output signal of the level shifter 261. The PMOS transistor P18 may be coupled between the power-supply voltage (VDD1) input terminal and the internal voltage (VINT) output terminal, and may thus receive the output signal of the inverter IV14 through a gate terminal of the PMOS transistor P18. The NMOS transistor N16 may be coupled between the internal voltage (VINT) output terminal and the feedback voltage (FEED) output terminal, such that a gate terminal and a drain terminal of the NMOS transistor N16 may be commonly coupled to each other.

During activation of the enable signal EN, the pull-down driver 270 may pull down the feedback voltage FEED. The pull-down driver 270 may include NMOS transistors N17 and N18 (pull-down drive elements).

The NMOS transistors N17 and N18 may be coupled in series between the feedback voltage (FEED) output terminal and the ground voltage terminal. A gate terminal and a drain terminal of the NMOS transistor N17 may be commonly coupled to each other. The NMOS transistor N18 may receive the enable signal EN through a gate terminal of the NMOS transistor N18.

The load circuit 280 may include a capacitor C2 coupled between the internal voltage (VINT) output terminal and the ground voltage terminal. The capacitor C2 may control a load capacitance of the internal voltage VINT.

Operations of the embodiment illustrated in FIG. 5 will hereinafter be described in detail.

If the test signal TM is deactivated to a low level and the active signal ACTEN is activated, the enable signal generator 100_1 may activate the enable signal EN. In this case, the enable signal generator 100_1 may activate the enable signal EN using the power-supply voltage VDD2 as a power source.

That is, when the test signal TM is activated, the enable signal ENB is at a high level, such that the voltage controller 250 might not operate. In contrast, when the active signal ACTEN is activated, the enable signal ENB is at a low level and the enable signal EN is at a high level, such that the voltage controller 250 may operate.

If the enable signal EN generated from the enable signal generator 100_1 is activated, the NMOS transistor N12 is turned on, such that the comparator 251 may operate. In this case, the PMOS transistor P13 of the pull-up circuit 252 and the PMOS transistor P14 of the pull-up circuit 253 may be turned off, such that the pull-up circuits 252 and 253 might not operate. As a result, the comparator 251 may compare the reference voltage VREF with the feedback voltage FEED, and may thus output the result of comparison to the nodes OUT_A and OUT_B.

Operations of the voltage controller 250 illustrated in FIG. 5 are identical to those of the voltage controller 210 illustrated in FIG. 3, and as such a detailed description thereof will herein be omitted for convenience of description and a better understanding of the present disclosure. However, the embodiment illustrated in FIG. 5 may use the power-supply voltage VDD2 instead of the power-supply voltage VDD1 as a power source of the voltage controller 250, differently from the embodiment of FIG. 3.

An embodiment of the present disclosure has exemplarily disclosed that the power source of the voltage controller 250 is set to the power-supply voltage (VDD2) level. However, the scope and spirit of the present disclosure is not limited thereto, and the power source of the voltage controller 250 may also be set to the power-supply voltage (VDD) level as necessary.

Thereafter, when the enable signal EN is activated, the voltage driver 260 may level-shift the power source of the drive voltage DRV from the power-supply voltage (VDD2) level to the power-supply voltage (VDD1) level. The PMOS transistor P18 of the voltage driver 260 may be selectively turned on according to the output signal of the delay circuit 262, such that the internal voltage (VINT) level may be output as the power-supply voltage (VDD1) level.

If the enable signal EN is deactivated, the PMOS transistor P17 is turned on. As a result, the drive voltage DRV is pulled up to the power-supply voltage (VDD2) level, such that the voltage driver 260 might not operate.

As described above, the voltage generation circuit illustrated in FIG. 5 may use the power source of the voltage controller 250 as the power-supply voltage VDD2, and may generate a level of the power-supply voltage VDD1 higher than the power-supply voltage VDD2 through the level shifter 261 of the voltage driver 260. In this case, the enable signal generator 100_1 does not include a separate level shifter, resulting in a simplified circuit configuration.

The voltage generation circuit illustrated in FIG. 5 may use the power-supply voltage VDD2, that has a lower level not only in the enable signal generator 100_1 but also in the voltage controller 250, as a power source, resulting in reduced power consumption.

As is apparent from the above description, the voltage generation circuit according to an embodiment of the present disclosure may supply a stable voltage and reduce power consumption using a Low Drop Out (LDO) regulator.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined based on the appended claims and their legal equivalents, not by the above description. Further, all changes coming within the meaning and equivalency range of the appended claims are intended to be embraced therein. In addition, it is obvious to those skilled in the art that claims that do not explicitly cite each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A voltage generation circuit comprising:
    an enable signal generator configured to shift a voltage level based on a test signal and an active signal, and generate a level-shifted enable signal;

a voltage controller configured to compare a reference voltage with a feedback voltage, amplify a result of the comparison, and generate a drive voltage, during activation of the enable signal;

a voltage driver configured to output an internal voltage by driving the drive voltage, and generate the feedback voltage corresponding to the internal voltage, wherein the feedback voltage is pulled down during activation of the enable signal, wherein the enable signal generator includes:

a level shifter configured to shift a power source to a second power-supply voltage, the second power-supply voltage greater than a first power-supply voltage.

2. The voltage generation circuit according to claim 1, wherein the enable signal generator selectively activates the enable signal based on a logic level of the active signal, during deactivation of the test signal.

3. The voltage generation circuit according to claim 1, wherein:

in the enable signal generator, the test signal and the active signal use the first power-supply voltage as a power source for driving logic operations performed on the test signal and active signal, and the enable signal uses the second power-supply voltage greater than the first power-supply voltage as a power source for generating the enable signal.

4. The voltage generation circuit according to claim 1, wherein the voltage controller includes:

a comparator configured to compare the reference voltage with the feedback voltage during activation of the enable signal;

a pull-up circuit configured to pull up an output node of the comparator with the second power-supply voltage to a level of the second power-supply voltage during activation of the enable signal, the second power-supply voltage greater than the first power-supply voltage; and a biasing circuit configured to control the drive voltage based on an output voltage of the comparator, during activation of an inversion signal of the enable signal.

5. The voltage generation circuit according to claim 4, wherein the voltage controller is driven using the second power-supply voltage as a power source.

6. The voltage generation circuit according to claim 1, wherein the voltage driver includes:

a first pull-up drive element configured to pull up the drive voltage during activation of the enable signal;

a delay circuit configured to delay the drive voltage;

a second pull-up drive element configured to pull up the internal voltage to with the second power-supply voltage to a level of the second power-supply voltage based on an output signal of the delay circuit, the second power-supply voltage greater than the first power-supply voltage; and a first pull-down drive element coupled between an output terminal of the internal voltage and an output terminal of the feedback voltage, such that a gate terminal and a drain terminal of the first pull-down drive element are commonly coupled to each other.

7. The voltage generation circuit according to claim 6, wherein the voltage driver is driven using the second power-supply voltage as the power source.

8. The voltage generation circuit according to claim 1, further comprising a pull-down driver configured to pull down the feedback voltage during activation of the enable signal, wherein the pull-down driver includes:

a first pull-down drive element having gate and drain terminals commonly coupled to an output terminal of the feedback voltage; and a second pull-down drive element coupled between the first pull-down drive element and a ground voltage terminal, and configured to receive the enable signal through a gate terminal of the second pull-down element.

9. The voltage generation circuit according to claim 1, further comprising:

a load circuit configured to control a load capacitance of the internal voltage.

10. A voltage generation circuit comprising:

an enable signal generator configured to generate an enable signal based on a test signal and an active signal;

a voltage controller configured to compare a reference voltage with a feedback voltage, amplify a result of the comparison, and generate a drive voltage, during activation of the enable signal;

a voltage driver configured to level-shift the drive voltage, output a level-shifted internal voltage, and generate the feedback voltage corresponding to the internal voltage, wherein the feedback voltage is pulled down during activation of the enable signal, wherein the enable signal generator includes:

a first level shifter configured to shift a power source to a second power-supply voltage, the second power-supply voltage greater than a first power-supply voltage.

11. The voltage generation circuit according to claim 10, wherein the enable signal generator activates the enable signal when an inverted version of the test signal and the active signal are activated.

12. The voltage generation circuit according to claim 10, wherein the enable signal generator uses the first power-supply voltage level as a power source.

13. The voltage generation circuit according to claim 10, wherein the voltage controller includes:

a comparator configured to compare the reference voltage with the feedback voltage during activation of the enable signal;

a pull-up circuit configured to pull up an output node of the comparator to the first power-supply voltage level during activation of the enable signal; and a biasing circuit configured to control the drive voltage based on an output voltage of the comparator, during activation of an inversion signal of the enable signal.

14. The voltage generation circuit according to claim 13, wherein the voltage driver is driven using the first power-supply voltage as a power source.

15. The voltage generation circuit according to claim 10, wherein the voltage driver includes:

a second level shifter configured to shift a power source of the drive voltage to the second power-supply voltage, the second power-supply voltage greater than the first power-supply voltage.

16. The voltage generation circuit according to claim 15, wherein the voltage driver includes:

a first pull-up drive element configured to pull up the drive voltage during activation of the enable signal;

a delay circuit configured to delay an output signal of the second level shifter;

a second pull-up drive element configured to pull up the internal voltage to the second power-supply voltage level based on an output signal of the delay circuit; and a first pull-down drive element coupled between an output terminal of the internal voltage and an output terminal of the feedback voltage, such that a gate terminal and a drain terminal of the first pull-down drive element are commonly coupled to each other.

17. The voltage generation circuit according to claim 16, wherein:
- the first pull-up drive element is driven using the first power-supply voltage as a power source; and
- the delay circuit, the second pull-up drive element, and the first pull-down drive element are driven using the second power-supply voltage as a power source.

18. The voltage generation circuit according to claim 10, further comprising a pull-down driver configured to pull down the feedback voltage during activation of the enable signal, wherein the pull-down driver includes:
- a first pull-down drive element having gate and drain terminals commonly coupled to an output terminal of the feedback voltage; and
- a second pull-down drive element coupled between the first pull-down drive element and a ground voltage terminal, and configured to receive the enable signal through a gate terminal the second pull-down drive element.

19. The voltage generation circuit according to claim 10, further comprising:
- a load circuit configured to control a load capacitance of the internal voltage.

* * * * *